(12) United States Patent
Chidambarrao et al.

(10) Patent No.: US 7,538,391 B2
(45) Date of Patent: May 26, 2009

(54) CURVED FINFETS

(75) Inventors: Dureseti Chidambarrao, Weston, CT (US); Shreesh Narasimha, Beacon, NY (US); Edward J. Nowak, Essex Junction, VT (US); John J. Pekarik, Underhill, VT (US); Jeffrey W. Sleight, Ridgefield, CT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 11/621,228

(22) Filed: Jan. 9, 2007

(65) Prior Publication Data

US 2008/0164535 A1  Jul. 10, 2008

(51) Int. Cl.
*H01L 29/78* (2006.01)
*H01L 21/336* (2006.01)

(52) U.S. Cl. ............... 257/347; 257/353; 257/401; 257/E21.409; 257/E21.421; 257/E29.264; 438/164

(58) Field of Classification Search ............ 438/164
See application file for complete search history.

(56) References Cited

U.S. PATENT DOCUMENTS

| | | | |
|---|---|---|---|
| 6,717,216 B1 * | 4/2004 | Doris et al. ............... | 257/347 |
| 6,794,718 B2 * | 9/2004 | Nowak et al. ............. | 257/347 |
| 6,800,910 B2 | 10/2004 | Lin et al. | |
| 6,855,990 B2 * | 2/2005 | Yeo et al. ................. | 257/353 |
| 7,348,638 B2 * | 3/2008 | Chidambarrao ........... | 257/374 |
| 7,462,916 B2 * | 12/2008 | Williams et al. .......... | 257/395 |
| 2003/0201458 A1 | 10/2003 | Clark et al. | |
| 2004/0061178 A1 | 4/2004 | Lin et al. | |
| 2004/0126975 A1 | 7/2004 | Ahmed et al. | |
| 2004/0169239 A1 | 9/2004 | Rim | |
| 2004/0195624 A1 | 10/2004 | Liu et al. | |
| 2004/0195627 A1 | 10/2004 | Dakshina-Murthy et al. | |
| 2004/0198031 A1 | 10/2004 | Lin et al. | |

(Continued)

*Primary Examiner*—N Drew Richards
*Assistant Examiner*—Eric Ward
(74) *Attorney, Agent, or Firm*—Gibb I.P. Law Firm, LLC; Richard M. Kotulak, Esq.

(57) ABSTRACT

A method of forming a transistor patterns a semiconductor fin on a substrate, such that the fin extends from the substrate. Then, the method forms a gate conductor over a central portion of the fin, leaving end portions of the fin exposed. Next, the end portions of the fin are doped with at least one impurity to leave the central portion of the fin as a semiconductor and form the end portions of the fin as conductors. The end portions of the fin are undercut to disconnect the end portions of the fin from the substrate, such that the fin is connected to the substrate along a central portion and is disconnected from the substrate along the end portions and that the end portions are free to move and the central portion is not free to move. A straining layer is formed on a first side of the fin and the straining layer imparts physical pressure on the fin such that the end portions are permanently moved away from a straight-line orientation with the central portion after the forming of the straining layer. Thus, the undercutting in combination with the forming of the straining layer curves the fin such that, when viewed from a top of the substrate, the fin is bowed and has a curved shape.

10 Claims, 3 Drawing Sheets

U.S. PATENT DOCUMENTS

2005/0040444 A1* 2/2005 Cohen .................. 257/288
2005/0093154 A1 5/2005 Kottantharayil et al.
2005/0227498 A1 10/2005 Furukawa et al.
2006/0284255 A1* 12/2006 Shin et al. ............... 257/351
2007/0190708 A1* 8/2007 Kaneko et al. ........... 438/157
2008/0116517 A1* 5/2008 Anderson et al. ......... 257/350

* cited by examiner

CURVED FINFETS

CROSS-REFERENCE TO RELATED APPLICATIONS

This application is related to pending U.S. application Ser. No. 11/162,660 filed on Sep. 19, 2005 to Nowak et al., assigned to the current assignee, and is incorporated herein by reference.

BACKGROUND

1. Field of the Invention

The embodiments of the invention generally relate to fin-type field effect transistors (FINFETs) and more particularly to curved or bent fins within such FINFETs.

2. Description of the Related Art

The aspect of and methods of manufacture of FINFETs with straining layers is well-known to those ordinarily skilled in the art as evidenced by U.S. Patent Publications 2005/0093154; 2004/0195624; and 2004/0061178 the complete disclosures of which are incorporated herein by reference.

As explained in U.S. Patent Publication 2005/0227498, the complete disclosure of which is incorporated herein by reference, field effect transistors fabricated on an SOI structure include a channel formed in the active silicon layer. Carrier mobility is an important parameter because of its direct influence on output current and switching performance of the field effect transistors. Accordingly, one approach for increasing device performance is to enhance the channel mobility by straining the active silicon layer. A net strain may be provided by introducing compressive stress into the silicon active layer or by introducing tensile stress into the silicon active layer. Straining the crystal lattice in the plane of the silicon layer either locally or globally alters the electronic band structure of the silicon layer. As a result, in-plane carrier mobility may be increased by ten to twenty-five percent, which results in improved device performance.

SUMMARY

An embodiment of the invention provides a method of forming a fin-type transistor. The method patterns a semiconductor fin on a substrate, such that the fin extends from the substrate. Then, the method forms a gate conductor over a central portion of the fin, leaving end portions of the fin exposed. Next, the end portions of the fin are doped with at least one impurity to leave the central portion of the fin as a semiconductor and form the end portions of the fin as conductors.

One feature of the inventive method is that the end portions of the fin are undercut to disconnect the end portions of the fin from the substrate, such that the fin is connected to the substrate along a central portion and is disconnected from the substrate along the end portions and that the end portions are free to move and the central portion is not free to move. A straining layer is formed on a first side of the fin and the straining layer imparts physical pressure on the fin such that the end portions are permanently moved away from a straight-line orientation with the central portion after the straining layer is formed. Thus, the undercutting in combination with the forming of the straining layer curves the fin such that, when viewed from a top of the substrate, the fin is bowed and has a curved shape.

In addition, a second straining layer can be formed on a second side of the fin opposite the first side of the fin so that the second straining layer produces an opposite type of strain within the fin when compared to the first straining layer to help the fin bow. The straining layer(s) can comprise a compressive straining layer and/or a tensile straining layer. After forming the straining layer, when viewed from a side of the substrate, the fins have a substantially rectangular cross-sectional shape. The height of the substantially rectangular cross-sectional shape is greater than the width of the substantially rectangular cross-sectional shape.

Further, an apparatus embodiment can comprise a transistor structure that includes the fin extending from the substrate. Again, the central portion of the fin comprises a semiconductor and the end portions of the fin comprise conductors. Similarly, the fin is connected to the substrate along the central portion and is disconnected from the substrate along the end portions such that the end portions are free to move and the central portion is not free to move. The gate conductor is positioned over the central portion of the fin and the straining layer is positioned on a first side of the fin. The straining layer imparts physical pressure on the fin such that the end portions are permanently moved away from a straight-line orientation with the central portion. As mentioned above, when viewed from a top of the substrate, the fin is bowed and has a curved shape. The curved shape is such that a line connecting the end portions of the fin is offset from a center line running along the central portion of the fin.

The structure similarly can include a second straining layer on a second side of the fin opposite the first side of the fin (the second straining layer produces an opposite type of strain within the fin when compared to the first straining layer). Either straining layer can comprise a compressive straining layer or a tensile straining layer.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
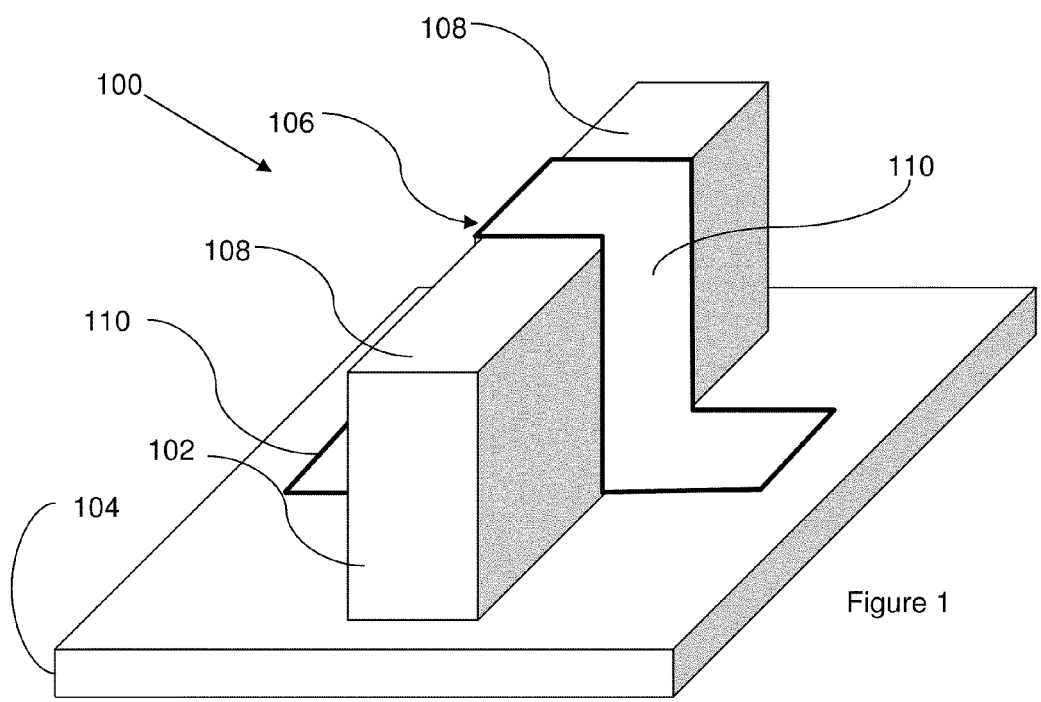
FIG. 1-4 are schematic perspective view diagrams illustrating different stages of formation of a FINFET transistor.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 4:
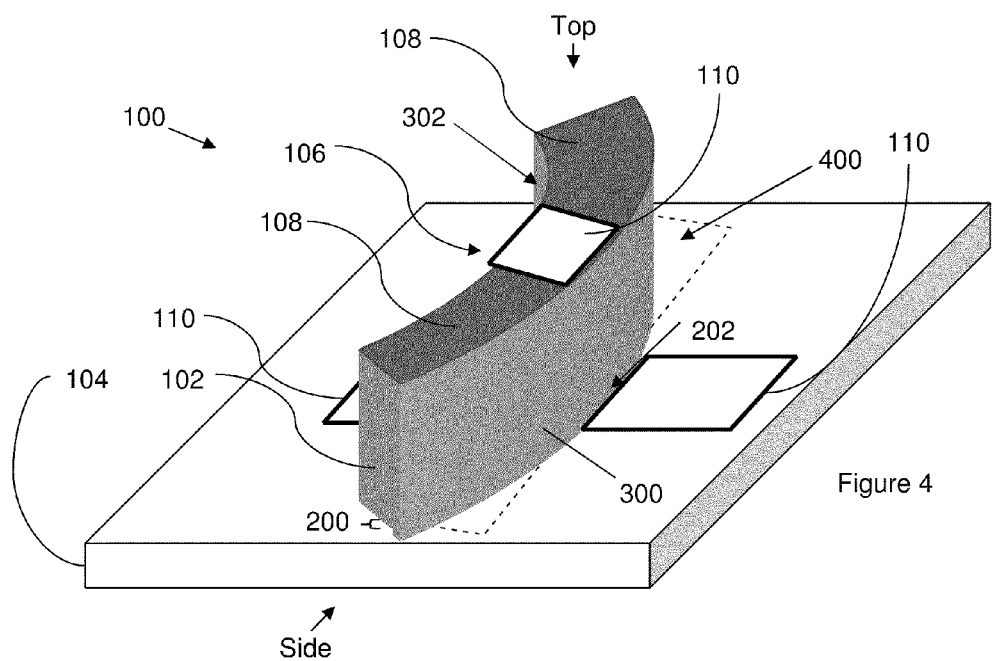

An apparatus embodiment is shown in transistor form in FIG. 4. The transistor structure 100 in FIG. 4 includes a fin 102 extending from a substrate 104. The central portion 106 of the fin 102 comprises a semiconductor and the end portions 108 of the fin 102 comprise conductors. The end portions 108 can be, for example source/drains, emitter/ collectors, etc. and the center portion 106 can be the channel, base, etc. Similarly, the fin 102 is connected to the substrate 104 along the central portion 106 (as shown by arrow 202) and is disconnected from the substrate 104 along the end portions 108 (and the end portions 108 may be separated from the substrate 104 by an air gap or a material such as an insulator in the final structure). Therefore, in the final structure the substrate 104 is directly connected to the central portion 106 of the fin while the end portions 108 are either indirectly connected to the substrate 104 (if there is a later deposited material that accumulates between the bent end portions 106) or is not connected to the substrate (if there is an air gap between the bent end portions 106 and the substrate 104). Therefore, the end portions 108 are free to move, and the central portion 106 is not free to move with respect to the substrate. The dashed line 400 represents the position of the ends 108 of the fin 102 before they were curved by the influence of straining layer(s) 300, 302.

A gate conductor 110 is positioned over the central portion 106 of the fin 102 and a straining layer 300 is positioned on a first side of the fin 102. The straining layer 300 imparts physical pressure on the fin 102 such that the end portions 108 are permanently moved away from a straight-line orientation with the center line of the central portion 106. The straight-line orientation of the fin 102 is shown by rectangle 400 and represents the position of the fin 102 before it is curved.

Figure 5:
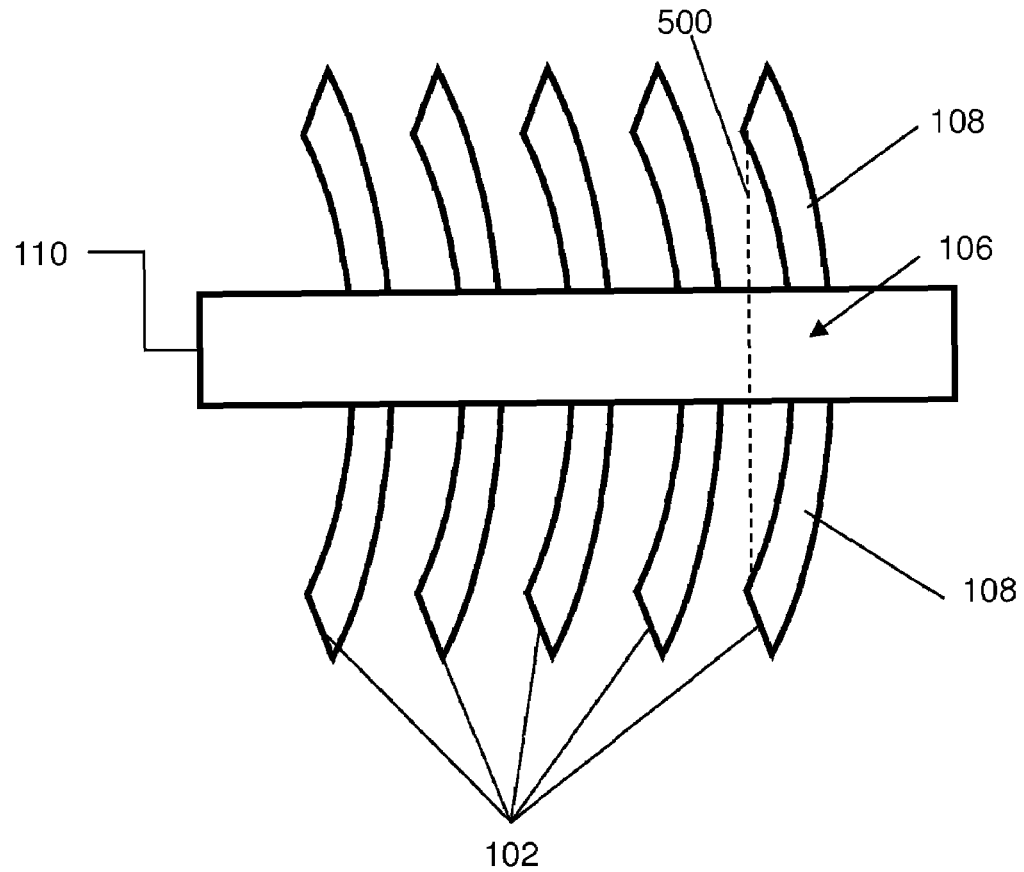
FIG. 5 is a schematic top view diagram illustrating a FINFET transistor having a common gate and multiple fins.

FIG. 5 illustrates a plurality of such parallel fins 102 viewed from the top. The gate conductor 110 in this example comprises a common gate conductor and overlies the central portions 106 of the fins 102. As shown in FIG. 5, when viewed from the top of the substrate 104, the fins 102 are bowed and have a curved shape. The curved shape is such that a line, such as dashed line 500, connecting the end portions 108 of the fin 102 is offset from the center line of the central portion 106 of the fin 102.

The structure similarly can include a second straining layer 302 on a second side of the fin 102 opposite the first side of the fin 102 (the second straining layer 302 produces an opposite type of strain (compressive) within the fin 102 when compared to the first straining layer 300 (tensile). Either straining layer 300, 302 can comprises a compressive straining layer or a tensile straining layer. Within the transistor, when viewed from a side of the substrate 104, the fin 102 has a substantially rectangular cross-sectional shape. As shown in FIGS. 1-4, the height of the substantially rectangular cross-sectional shape is greater than the width of the substantially rectangular cross-sectional shape.

Figure 6:
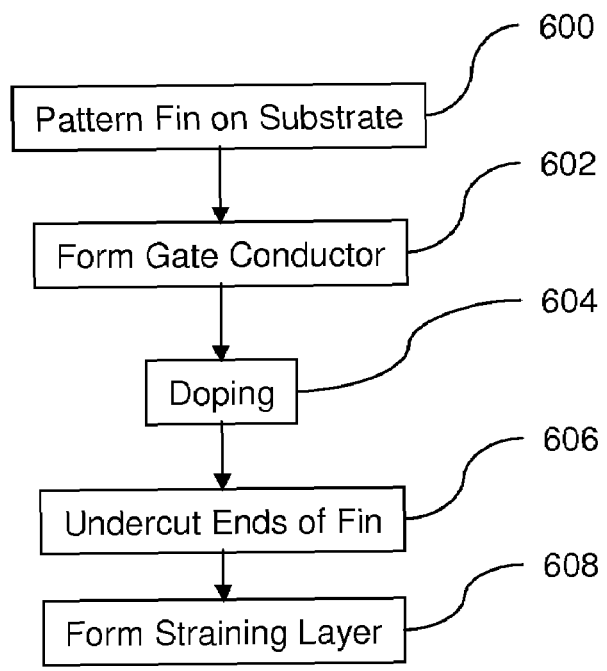
FIG. 6 is a flow diagram illustrating a method of an embodiment of the invention.

One exemplary method of forming such a transistor is shown schematically in FIGS. 1-4 and in flowchart form in FIG. 6. As would be understood by one ordinarily skilled in the art, FINFETs and similar types of transistors, straining layers, conductors, insulators, contacts, and other similar structures can be manufactured according to a number of different methodologies, such as those disclosed in U.S. Patent Publications 2005/0227498; 2005/0093154; 2004/0195624; and 2004/0061178 the complete disclosures of which are incorporated herein by reference above. Many of the specific details of such methodologies are omitted herefrom in order to focus the reader on the salient portions of the present invention. Further, the present invention is not limited strictly to the methodologies disclosed by the incorporated references. Instead, any manufacturing methodologies, whether well-known or developed in the future, can be utilized with the invention.

More specifically, as shown in item 600 and in FIG. 1, the method patterns the semiconductor fin 102 on the substrate 104, such that the fin 102 extends from the substrate 104. An insulator (oxide) layer 112 can be below the fin and between the fin 102 and the substrate 104. For example, a semiconductor layer can be patterned into fins using many different well-known methodologies including masking and etching, sidewalls spacer formation, laser patterning, etc. Alternatively, single crystal silicon fins can be formed on the substrate or oxide layer and can be later doped with sufficient impurity that they comprise semiconductors.

Then, the method forms a gate conductor 110 over a central portion 106 of the fin 102 in item 602, leaving end portions 108 of the fin 102 exposed. The end portions 108 of the fin 102 are doped with at least one impurity to leave the central portion 106 of the fin 102 as a semiconductor and form the end portions 108 of the fin 102 as conductors, as represented by item 604 in FIG. 6. The resulting structure is shown in FIG. 1. See U.S. Patent Publication 2005/0145954 (incorporated herein by reference) for more details regarding semiconductor fin formation.

Figure 2:
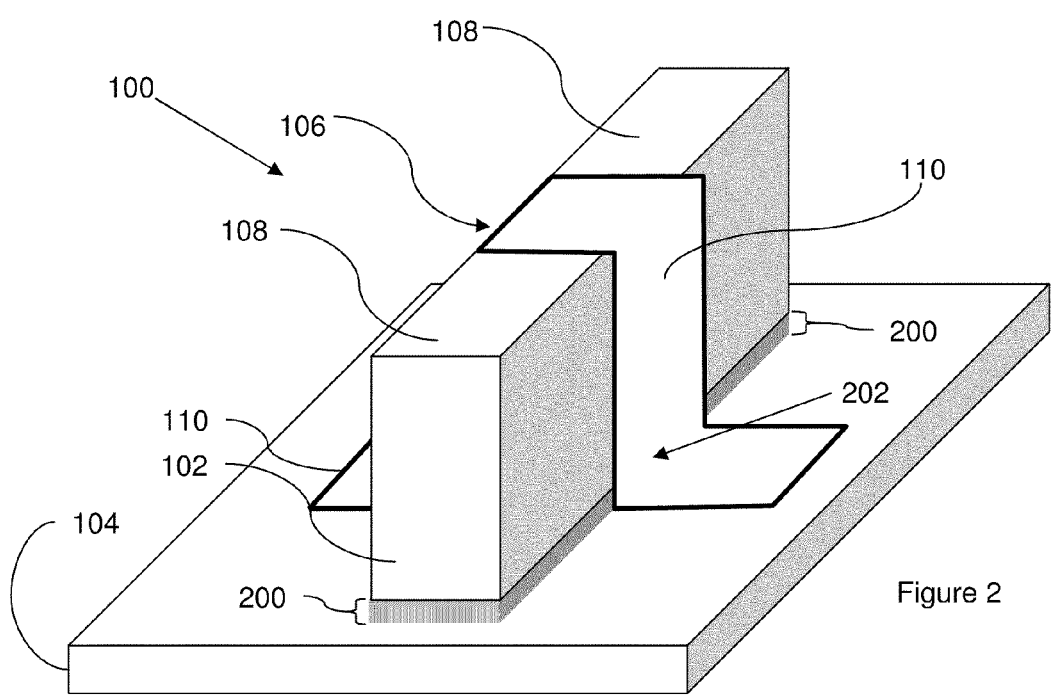

One feature of the inventive method that is shown in item 606 and FIG. 2, is that the end portions 108 of the fin 102 are undercut to disconnect the end portions 108 of the fin 102 from the substrate 104, such that the fin 102 is connected to the substrate 104 along a central portion 106 and is disconnected from the substrate 104 along the end portions 108. Undercutting could be accomplished in many ways, for example, by selective etching of the oxide of the SOI structure 104 (note that the gate conductor 110 protects the underlying oxide beneath the central portion 106) or by incorporating a sacrificial layer 112 at the bottom of the FIN and selectively etching that sacrificial layer 112. For purposes of this application, the oxide, sacrificial layer, etc., is considered to be part of the substrate. Thus, when the central portion 106 is said to be connected to the substrate, it could be considered to be connected to the substrate by the oxide layer, the sacrificial layer, etc. Alternatively, the oxide layer, the sacrificial layer, etc., could be considered part of the substrate 104. In any case, because the oxide layer, the sacrificial layer, etc., is removed from beneath the end portions 108 of the fin 102 during the undercutting process 606, the end portions are no longer connected to the substrate 104.

FIG. 2, areas 200 represent gaps under the end portions 108 of the fin 102 and area 202 represents a region of the fin 102 that was protected from the undercutting process (606) by the presence of the gate 110. Thus, area 202 represents a region of the fin 102 that remains connected to the underlying substrate 104. The end portions 108 are free to move and the central portion 106 is not free to move.

Figure 3:
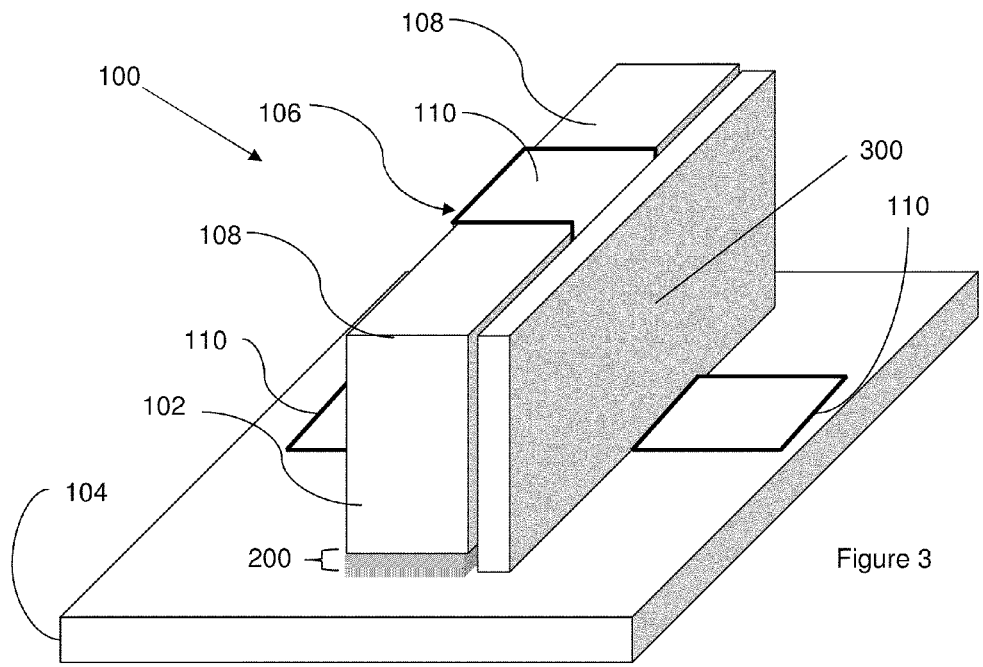

As shown in item 608 in FIG. 6 and as shown schematically in FIGS. 3 and 4, a straining layer 300 is formed on a first side of the fin 102. The methodologies for forming straining layers are well-known to those ordinarily skilled in the art. For example, see the straining layers discussed in the previously incorporated references, as well as the discussion in U.S. Patent Publication 2005/0145941, the complete disclosure of which is also incorporated herein by reference. FIG. 3 represents the straining layer 300 as it is being formed on the fin and FIG. 4 represents the results after the straining layer 300 is formed on the fin. As shown in FIG. 4, the straining layer 300 imparts physical pressure on the fin 102 such that the end portions 108 are permanently moved away from a straight-line orientation with the center line of the central portion 106. The straight-line orientation of the fin 102 is shown by rectangle 400 and represents the position of the fin 102 before it is curved. Thus, the undercutting (606) in combination with the forming of the straining layer 300 (608) curves the fin 102 such that, when viewed from the top of the substrate 104, the fin 102 is bowed and has a curved shape.

In addition, a second straining layer 302 can be formed on a second side of the fin 102 opposite the first side of the fin 102, so that the second straining layer 302 produces an opposite type of strain within the fin 102 when compared to the first straining layer 300 to help the fin 102 bow. The straining layer(s) 300, 302 can comprise a compressive straining layer and/or a tensile straining layer.

Therefore, the present invention forms a bent fin within a FINFET by putting one side under tension or compression (or potentially putting one side under tension and the other side under compression) while undercutting the ends of the fin. This allows the strain to curve the fin into a bent shape which creates more stress within the crystalline lattice of the fin and thereby increases carrier mobility and produces a corresponding increase in device performance.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A transistor structure comprising:
   a substrate;
   a fin extending from said substrate, wherein a central portion of said fin comprises a semiconductor, wherein end portions of said fin comprise conductors, and wherein said fin is connected to said substrate along said central portion and is disconnected from said substrate along said end portions;
   a gate conductor over said central portion of said fin; and
   a straining layer on a first side of said fin,
   wherein, when viewed from a top of said substrate, said fin is bowed and has a curved shape.

2. The transistor according to claim 1, further comprising a second straining layer on a second side of said fin opposite said first side of said fin, wherein said second straining layer produces an opposite type of strain within said fin when compared to said first straining layer.

3. The transistor according to claim 1, wherein said straining layer comprises one of a compressive straining layer and a tensile straining layer.

4. The transistor according to claim 1, wherein, when viewed from a side of said substrate, said fins have a substantially rectangular cross-sectional shape, and wherein a height of said substantially rectangular cross-sectional shape is greater than a width of said substantially rectangular cross-sectional shape.

5. The transistor according to claim 1, wherein said curved shape is such that a line connecting said end portions of said fin is offset from said central portion of said fin.

6. A transistor structure comprising:
   a substrate;
   a fin extending from said substrate, wherein a central portion of said fin comprises a semiconductor, wherein end portions of said fin comprise conductors, and wherein said fin is connected to said substrate along said central portion and is disconnected from said substrate along said end portions such that said end portions are free to move and said central portion not free to move;
   a gate conductor over said central portion of said fin; and
   a straining layer on a first side of said fin that imparts physical pressure on said fin such that said end portions are permanently moved away from a straight-line orientation with said central portion,
   wherein, when viewed from a top of said substrate, said fin is bowed and has a curved shape.

7. The transistor according to claim 6, further comprising a second straining layer on a second side of said fin opposite said first side of said fin, wherein said second straining layer produces an opposite type of strain within said fin when compared to said first straining layer.

8. The transistor according to claim 6, wherein said straining layer comprises one of a compressive straining layer and a tensile straining layer.

9. The transistor according to claim 6, wherein, when viewed from a side of said substrate, said fins have a substantially rectangular cross-sectional shape, and wherein a height of said substantially rectangular cross-sectional shape is greater than a width of said substantially rectangular cross-sectional shape.

10. The transistor according to claim 6, wherein said curved shape is such that a line connecting said end portions of said fin is offset from said central portion of said fin.

* * * * *